United States Patent [19]

Matsuda et al.

[11] Patent Number: 5,088,063

[45] Date of Patent: Feb. 11, 1992

[54] SEMICONDUCTOR MEMORY DEVICE HAVING ON-CHIP TEST CIRCUIT

[75] Inventors: Yoshio Matsuda; Kazutami Arimoto; Tsukasa Ooishi; Masaki Tsukude; Kazuyasu Fujishima, all of Hyogo, Japan

[73] Assignee: Mitsubishi Denki Kabushiki Kaisha, Tokyo, Japan

[21] Appl. No.: 532,338

[22] Filed: Jun. 5, 1990

[30] Foreign Application Priority Data

Jun. 14, 1989 [JP] Japan .................. 1-152653

[51] Int. Cl.$^5$ ............................................ G11C 13/00
[52] U.S. Cl. ................................ 365/201; 365/189.01
[58] Field of Search .................... 365/189.01, 230.01, 365/201

[56] References Cited

FOREIGN PATENT DOCUMENTS 63-102094 6/1988 Japan .

OTHER PUBLICATIONS

Matsumura, "On-Chip Parallel Testing Technology for VLSI Memories", *Technology for Improving Testing Efficiency Suitable for Large Capacity Memories*, NTT Communications Laboratories, p. 165.

Inoue et al., "Parallel Testing Technology for VLSI Memories", *1987 International Test Conference*, p. 45.1, pp. 1066-1071.

*Primary Examiner*—Terrell W. Fears
*Attorney, Agent, or Firm*—Lowe, Price, LeBlanc & Becker

[57] ABSTRACT

In a memory cell array of a semiconductor memory device, a plurality of detection circuits (14, 15, 20) are provided in correspondence with a plurality of columns. An output line (L) is provided in common to the detection circuits (14, 15, 20). The output line (L) is provided with plural junction points (nl to nn) to which detection results from the detection circuits (14, 15, 20) are separately applied. Dividing transistors (Tl to Tn) are provided between the junction points (nl to nn). During testing, the work lines (WL1 to WLn) are selected sequentially. Test results for the memory cells (MC1 to MC4) connected to the selected word line are outputted at the corresponding junction points (nl to nn), respectively. Simultaneously, a dividing transistor corresponding to the selected word line is rendered non-conductive, the remaining dividing transistors being rendered conductive. As a result, the output line (L) is divided into two parts at a portion of the non-conductive transistor. Detection results outputted to the respective divided parts of the output line (L) are monitored and a portion at which a detection result is changed in each divided part is found out.

10 Claims, 9 Drawing Sheets

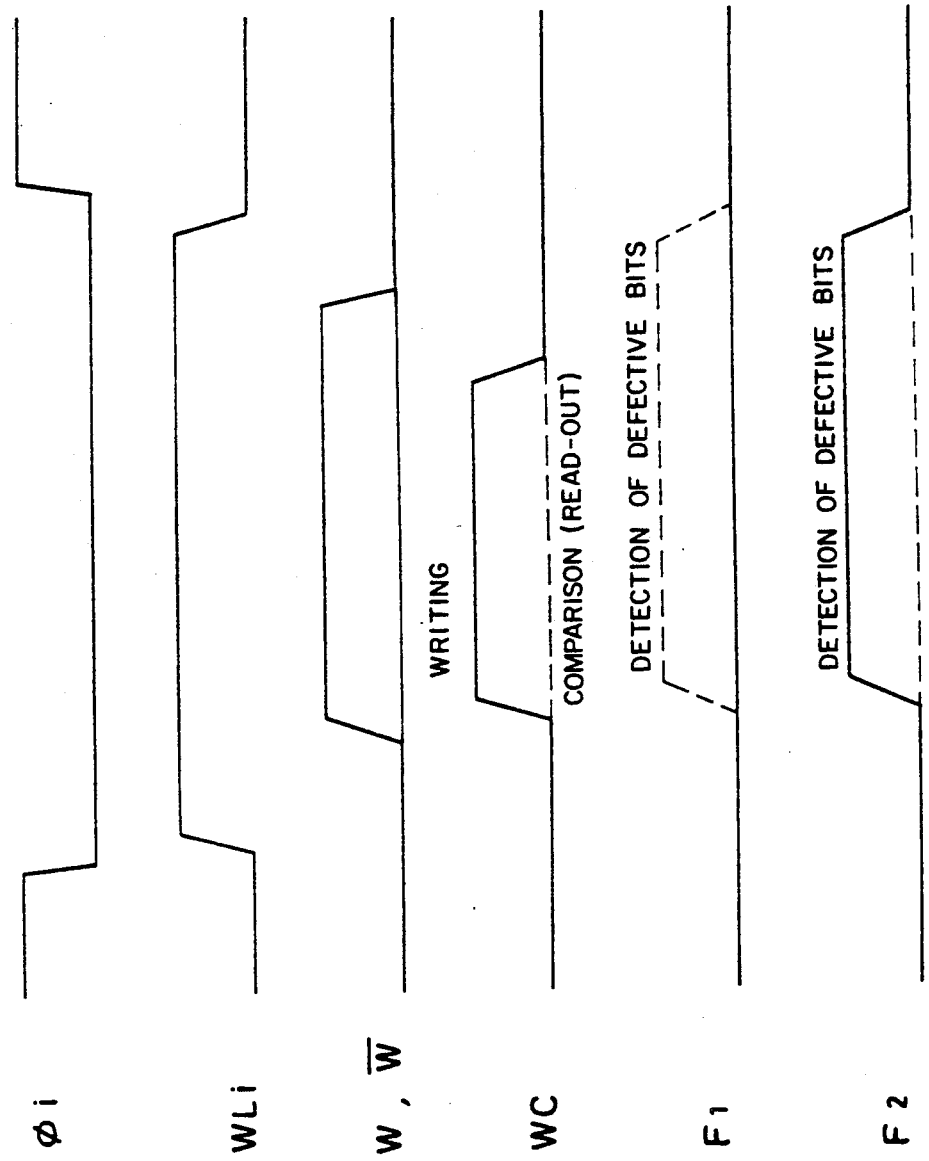

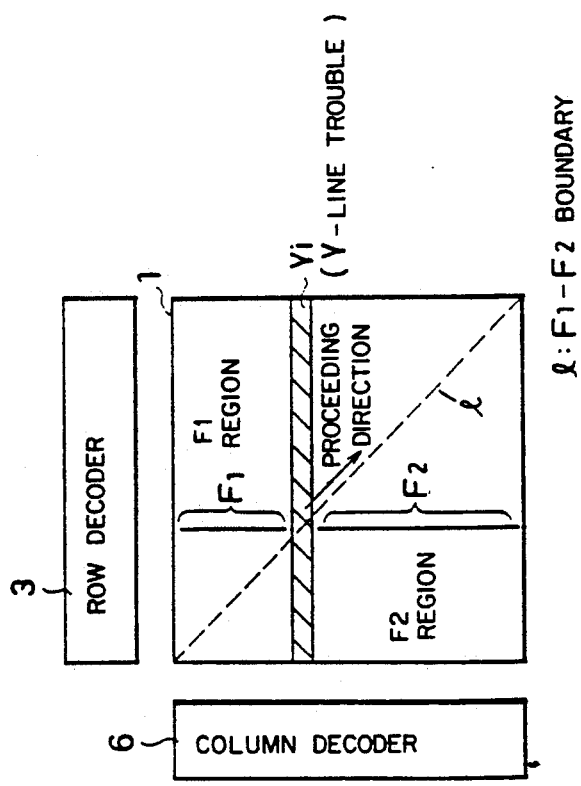

SEMICONDUCTOR MEMORY DEVICE HAVING ON-CHIP TEST CIRCUIT

CROSS-REFERENCE TO RELATED APPLICATION

This application has reference to our copending U.S. application Ser. No. 400,899, filed Aug. 30, 1989 commonly assigned with the present invention.

BACKGROUND OF THE INVENTION

1. Field of the Invention

This invention relates to a semiconductor memory device and, more particularly, to a semiconductor memory device having an on-chip test circuit, and the method for testing the semiconductor memory device.

1. Description of Background Art

Memory test time has been increasing with packing density. Especially, functional test time occupies a large part of the total test time in high packing density memories. In general, memory functions are tested using test patterns whose length is increasing with memory capacity N. Test patterns for memories can be classified into $N^2$, $N^{3/2}$, and N patterns according to their pattern length. The N patterns test memories by writing data into all cells and reading them. Though pattern lengths are different in their address and data sequences, they are proportional to N. The $N^2$ pattern can detect all interference effect between any two cells. The $N^{3/2}$ pattern can test interference effect between two cells connected to the same word or bit line. Though $N^2$ or $N^{3/2}$ patterns are suitable for testing pattern sensitivity of memory cells, test time using them is too long for practical use. In testing a 1 Mb memory chip at 500 ns cycle time, it takes about 9 minutes per chip to test using the $N^{3/2}$ pattern As this is not practical, N patterns are usually applied to test mega-bit level memories to reduce test time. In this case, test time is about 5 seconds using a 10N cycle Marching pattern. Though N patterns have been used so far, it will be difficult to apply even them in testing larger capacity memories.

Several methods have been reported on reduction of memory test time by testing cells in parallel. In testing DRAMs, test time reduction by testing four bits simultaneously, called multi-bit test, was reported. Also reported was a parallel test using a linear feedback shift register as a parallel signature analyzer[2].

With increase in the capacity of the semiconductor memory device, the problem of prolonged testing time has been presented as a serious problem. Thus a line mode testing method has been proposed as the method whereby the testing may be shortened significantly. According to this line mode testing method, all of the memory cells connected to a given word line can be tested simultaneously. These results in significant reduction of the testing time.

FIG. 7 is a block diagram showing the structure of the conventional dynamic random access memory (referred to hereinafter as a dynamic RAM) which is equipped with an on-chip testing circuit for line mode testing.

In a memory cell array 1 of FIG. 7, a plurality of word lines and a plurality of bit line pairs are arranged to intersect one another. A plurality of memory cells are provided at intersections thereof. The word lines in the memory cell array 1 are connected to a row decoder 3 by way of a word driver 2. The bit line pairs in the memory cell array 1 are connected to a column decoder 6 by way of a sense amplifier section 4 and an I/O switch 5.

A RAS buffer 7 is responsive to a row address strobe signal $\overline{RAS}$ supplied from outside to activate a row address buffer 8. The row address buffer 8 functions to latch an address signal A supplied from outside to supply it as a row address signal RA to the row decoder 3. The row decoder 3 is responsive to the row address signal RA to select one of the word lines to drive the selected word line by way of the word driver 2. Information in the memory cells connected to the driven word line is read out on corresponding bit line pairs, respectively. The sense amplifier 4 functions to sense and amplify the information on the bit line pairs.

On the other hand, a CAS buffer 9 is responsive to a column address strobe signal $\overline{CAS}$ supplied from outside to activate a column address buffer 10. The column address buffer 10 functions to latch the address signal A supplied from outside to supply it as a column address signal CA to the column decoder 6. The column decoder 6 is responsive to the column address signal CA to select one of the bit line pairs to connect the selected bit line pair to an input/output line pair I/O, I/O. In this manner, one of the word lines and one of the bit line pairs are selected so that information is read out or written from or to the memory cell at the intersection thereof. FIG. 7 shows only the selected word line WL, the selected bit line BL and the memory cell MC at the intersection thereof.

Information read-out or writing is selected by a read/write buffer 11. The read/write buffer 11 is responsive to a read/write signal R/W supplied from outside to activate an input buffer 12 or an output buffer 13. When the input buffer 12 is activated, an input data Din is written in the thus selected memory cell MC. When the output buffer 13 is activated, the information stored in the thus selected memory cell MC is read out as an output data Dout to outside.

A write circuit 14, a comparator circuit 15, a detection circuit 16 and a line test controller 17 are used for line mode testing. The line test controller 17 is responsive to a test enable signal $\overline{TE}$ supplied from outside to control the write circuit 14, the comparator circuit 15 and the detection circuit 16. The above described components 1 to 17 of the dynamic RAM are formed on one and the same chip 100.

FIG. 8 shows a detailed circuit diagram of essential portions of the dynamic RAM shown in FIG. 7. The circuit of FIG. 8 is disclosed in, for example, a lecture No. 165 of pre-papers for Electronic Information Communication Society, Branch of Semiconductor Materials 1987, entitles "Technology for Improving Testing Efficiency Suitable for Large Capacity Memories". The circuit of FIG. 8 is also disclosed in the Japanese Patent Laying-Open No. 63-102094.

In FIG. 8, only two sets of bit line pair BL1, BL1 and BL2, BL2 and four word lines WL1 to WL4, are shown. A sense amplifier 40 is connected to each of the bit line pairs BL1, BL1 and BL2, BL2. The bit line pair BL1, BL1 is connected to the input line pair I/O, I/O by way of transistors Q9, Q10, while the bit line pair BL2, BL2 is connected to the input/output line pair I/O, I/O by way of transistors Q11, Q12. Column select signals C1 and C2 are supplied from the column decoder 6 of FIG. 7 to the gates of the transistors Q9 and Q10 and the gates of the transistors Q11, Q12, respectively.

The write circuit 14 includes transistors Q1 to Q4, write lines W and $\overline{W}$ and a write control line WC. The comparator circuit 15 includes transistors Q5 to Q8 and the detection circuit 16 includes a precharge circuit 160, transistors S1 and S2 and an inverter G1.

The line mode testing method is hereinafter explained by referring to a waveform diagram of FIG. 9. In line mode testing, parallel writing and parallel comparison are performed.

For parallel writing, the potential at the word line WL1, for example, is raised to logically high level ("H" level). Desired testing data are then applied to the write lines W and $\overline{W}$. When logical high (or "H") is to be written as a testing data, and "H" level data and a logically low level data (an "L" level data) are applied to the write line W and $\overline{W}$, respectively. With the potential at the write control line WC raised to the "H" level, the transistors Q1 to Q4 are rendered conductive. This allows the potential at the write line W to be transmitted to the bit lines BL1 and BL2, and the potential at the write line $\overline{W}$ to be transmitted to the bit lines $\overline{BL1}$ and $\overline{BL2}$. The potential difference between the bit lines BL1 and $\overline{BL1}$ the potential difference between the bit lines BL2 and $\overline{BL2}$ are sensed and amplified by sense amplifiers 40. In this manner, test data are written simultaneously in all of the memory cells connected to the word line WL1. In FIG. 8, an "H" level data are written in the memory cells MC1 and MC3.

On the other hand, during parallel comparison, the potential at the write control line WC is maintained at the logically low level. That is, with the transistors Q1 to Q4 non-conductive, the word line WL1 is selected so that the potential at the word line WL1 is raised to the "H" level. This allows the data stored in the memory cells MC1 to MC3 to be read out on the bit lines BL1 and BL2. The potential difference between the bit lines BL1 and $\overline{BL1}$ and the potential difference between the bit lines BL2 and $\overline{BL2}$ and are sensed and amplified by the sense amplifiers 40. Data opposite to those written during the above writing is supplied to the write lines W, $\overline{W}$ as the expected data. That is, data at the "L" level is supplied to the write line W, while data at the "H" level are supplied to the write line $\overline{W}$.

If the data stored in the memory cells MC1 and MC3 are read out correctly, the potentials at the bit lines BL1 and BL2 are raised to the "H" level, while the potentials at the bit lines $\overline{BL1}$ and $\overline{BL2}$ are lowered to the "L" level. As a result, the transistors Q5 and Q7 are rendered conductive, while the transistors Q6 and Q8 are rendered non-conductive, so that the "L" level potential at the write line W is transmitted to nodes N1 and N2. This renders transistors S1 and S2 non-conductive. Thus the potential at the node N1, which has been precharged to the "H" level by the precharge circuit 160, remains at the "H" level, so that the potential at a detection result output line F remains at the "L" level.

It is now assumed that the data stored in the memory cell MC1 has been read out incorrectly by some reason or other. In this case, the potential at the bit line BL1 goes to the "L" level, while the potential at the bit line $\overline{BL1}$ goes to the "H" level. This renders the transistor Q5 non-conductive and the transistor Q6 conductive. As a result, the "H" level potential at the write line W is transmitted to the node N1 to render the transistor S1 conductive. Thus the potential at the node N1, which has been precharged to the "H" level by the precharge circuit 160, is discharged to the "L" level by way of the transistor S1. As a result, an "H" level signal appears on the detection result output line F.

In this manner, when all of the bits at the memory cells connected to the selected word line are normal, an "L" level signal appears on the detection result output line F. Conversely, if even one of the bits at the memory cells connected to the selected word line is in error, an "H" level signal appears on the detection result output line F. Thus the possible troubles of the memory cells may be determined for a word line.

The above described line mode testing is performed for all of the word lines to complete the testing for the totality of the memory cells. With the above described line mode testing, all of the memory cells connected to a word line can be tested simultaneously to permit significant shortening in the testing time.

In this case, since the row including a defective memory cell is replaced with a redundancy circuit, it is not necessary to specify the defective memory cell.

However, the large capacity semiconductor memory devices are subject to various failure modes besides the defects of the memory cells. For example, so-called a Y line failure, that is the trouble along the bit lines, may be produced due to bit line shorting or breakage or troubles in the sense amplifiers. When the above described conventional line mode testing method is applied to the semiconductor memory device suffering from the Y line failure, negative detection results will be issued for all of the word lines. Thus it cannot be determined whether the trouble is that of all bits of the memory cells or the Y line failure. Also, should the Y line failure exist, it is not possible to locate the Y line failure.

In the memory cell array comprising a plurality of memory cells MC as shown in FIG. 10, if it is possible to specify the column CY in which Y line failure exists, the column CY can be replaced with a redundancy circuit R comprising spare memory cells SMC.

SUMMARY OF THE INVENTION

It is an object of the present invention to improve the testing efficiency for a semiconductor memory device.

It is another object of the present invention to provide a semiconductor memory device having an on-chip testing circuit enabling the detection of the so-called Y line failure without increasing the testing time.

It is a further object of the present invention to provide a semiconductor memory device in which detection of Y line failure can be made simultaneously with line mode testing.

It is still another object of the present invention to provide a method for testing a semiconductor memory device enabling the detection of the Y line failure without increasing testing time.

In view of these and other objects, the semiconductor memory device according to the present invention includes a plurality of word lines, a plurality of bit lines intersecting the word lines, a plurality of memory cells at the intersections of the word lines and the bit lines, a first selector, a plurality of detectors, an output line and a dividing device.

During testing, the first selector sequentially selects the plural word lines. During testing, these plural detectors detect possible troubles of the memory cells connected to the word line selected by the first selector. The output line is connected in common to the detectors and has a plurality of junction points to which the detection results by the plural detectors are supplied separately. The dividing device functions to divide the output line into two parts at a portion between predetermined junction points in correspondence with the word line selected by the first selector.

In the semiconductor memory device of the present invention, line mode testing is performed sequentially for the word lines sequentially selected by the selector, while the output line is divided sequentially at the portions determined in correspondence with the sequentially selected word lines. Thus the detection results by the corresponding detectors are outputted at the respective divided parts of the output line. Detection results of the respective divided parts of the output line are monitored. If a Y line failure exists, a detection result of each divided part of the output line is changed when the output line is divided at a portion corresponding to the Y line failure. Therefore, each divided part of the output line may be monitored to find out a dividing portion at which the detection results are changed, to detect the so-called Y line failure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5B is a waveform diagram for illustrating the operation of the dynamic RAM of FIG. 1 during line mode testing.

FIG. 6A is a view for illustrating the line mode testing in the dynamic RAM shown in FIG. 1.

FIG. 6B is a diagram for illustrating the method for detecting the Y line failures in the dynamic RAM shown in FIG. 1.

DESCRIPTION OF THE PREFERRED EMBODIMENTS

Figure 1:
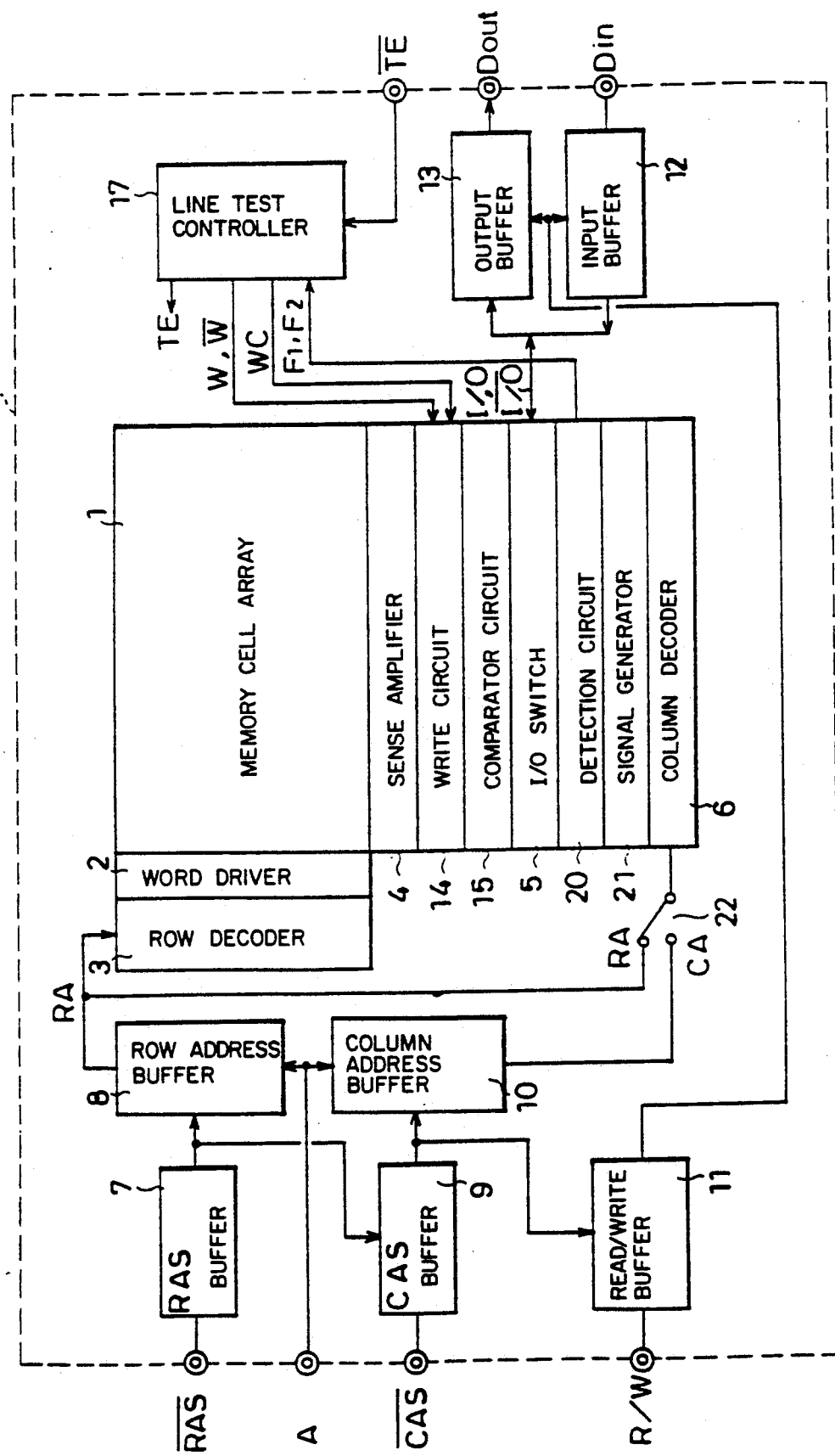
FIG. 1 is a block diagram showing the overall structure of a dynamic RAM provided with an on-chip testing circuit according to an embodiment of the present invention.

By referring to the drawings, a preferred embodiment of the present invention will be explained herein below in detailed.

FIG. 1 is a block diagram showing the structure of a dynamic RAM provided with an on-chip testing circuit according to an embodiment of the present invention.

Figure 7:
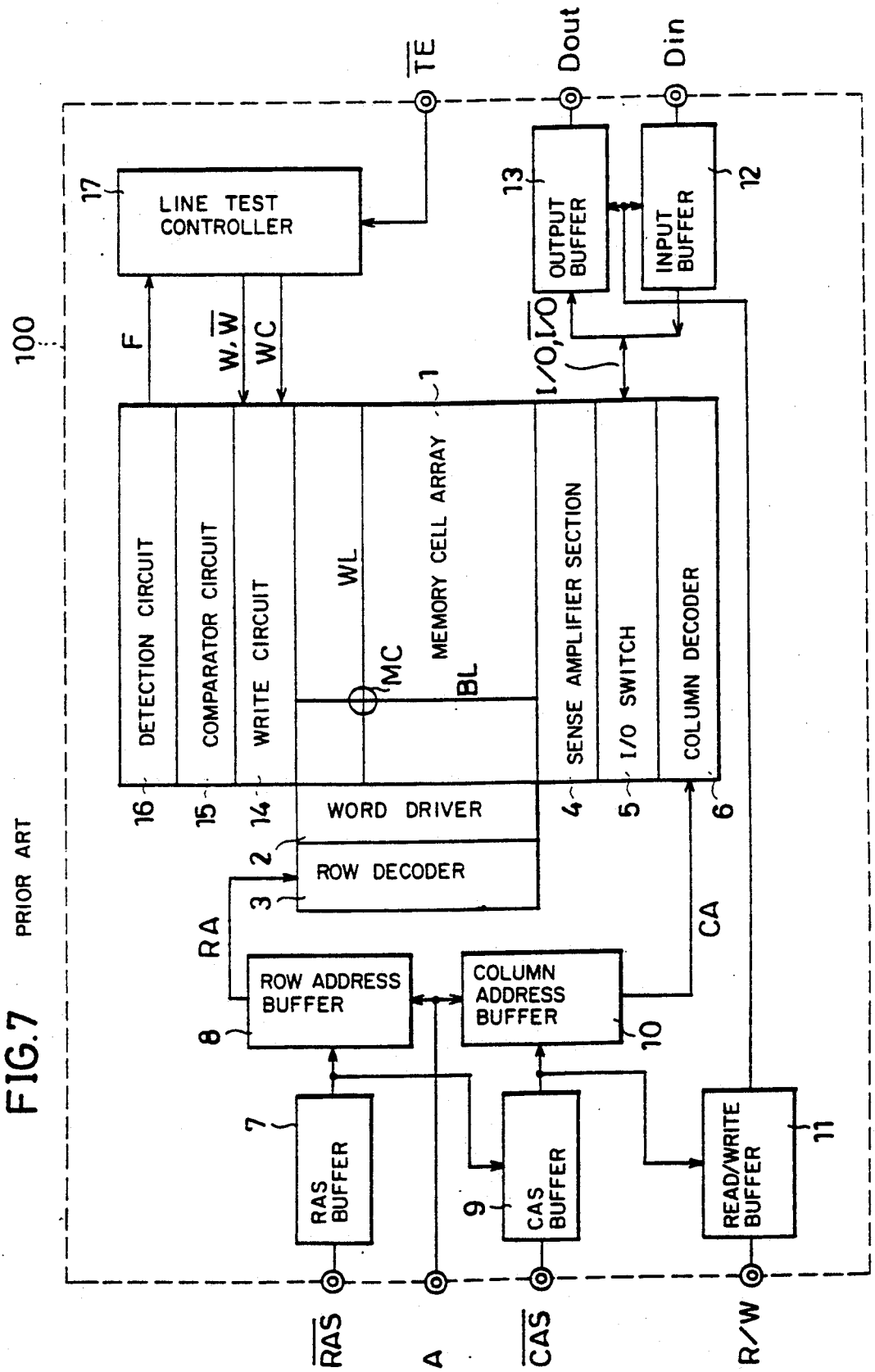
FIG. 7 is a block diagram showing the structure of a conventional dynamic RAM in which line mode testing is performed.

Referring to FIG. 1, a write circuit 14 and a comparator circuit 15 are arranged between a sense amplifier section 4 and an I/O switch 5. A detection circuit 20 and a signal generator 21 are provided, which are an important feature of the present invention, between the I/O switch 5 and a column decoder 6. A row address signal RA outputted from a row address buffer 8 and a column address signal CA outputted from a column address buffer 10 are supplied to a switch 22. In this manner, the row address signal RA or the column address signal CA is supplied selectively to the column decoder 6 by the switch 22. The dynamic RAM shown in FIG. 1 is otherwise the same in structure as the conventional dynamic RAM shown in FIG. 7.

Figure 2:
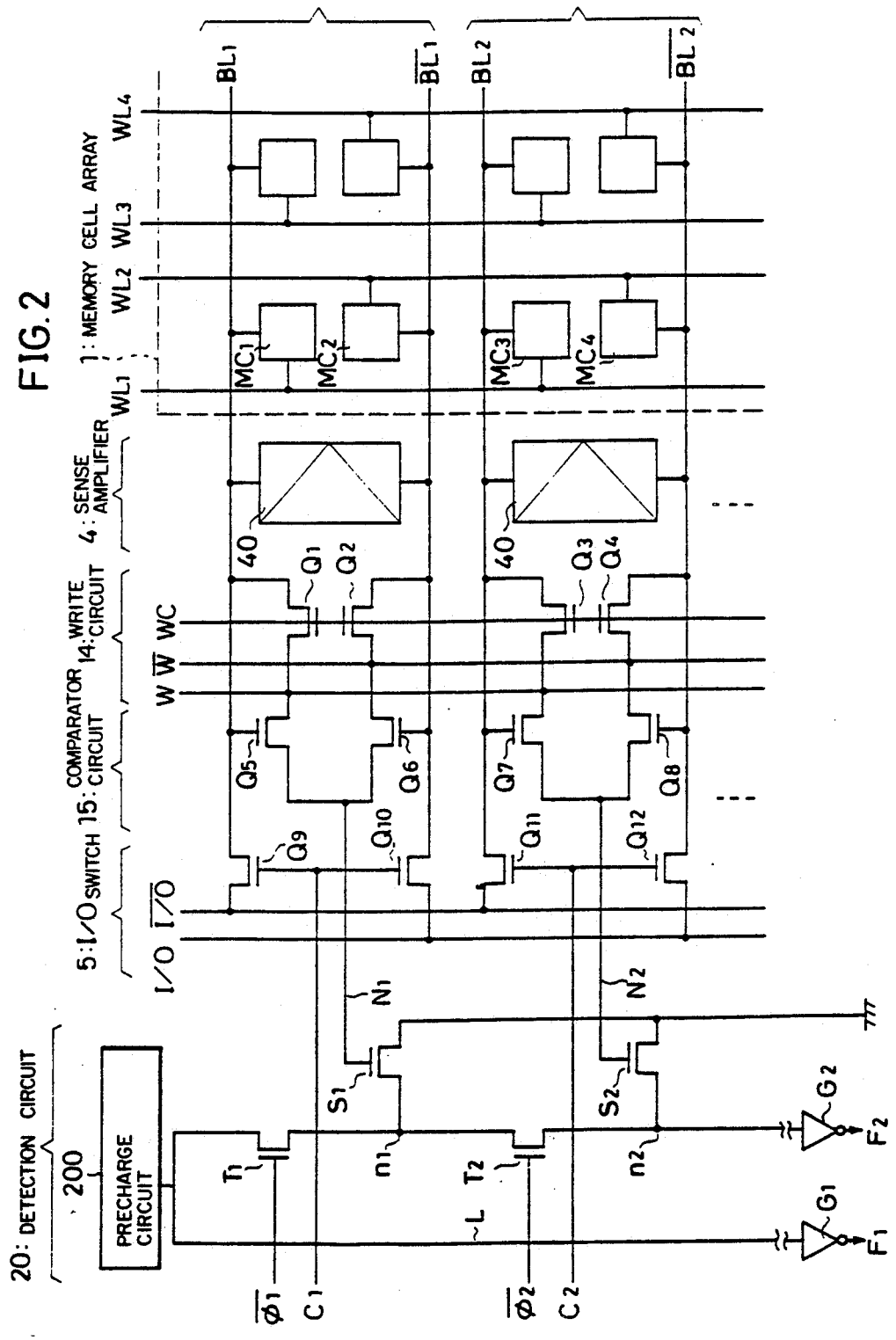
FIG. 2 is a circuit diagram showing the structure of essential portions of the dynamic RAM shown in FIG. 1.

FIG. 2 is a circuit diagram showing the structure of essential portions of the dynamic RAM shown in FIG. 1. Although the memory cell array 1 is comprised of n×n bit memory cells, only two set of columns Y1 and Y2 for two sets of bit line pairs BL1, BL1 and BL2, BL2 are shown in FIG. 2. The structure of the memory cell array 1, the sense amplifier section 4, the write circuit 14, the comparator circuit 15 and the I/O switch 5 is the same as that shown in FIG. 8. However, preferably, from the point of layout, the sense amplifier section 4, write circuit 14, comparator circuit 15 and the I/O switch 5 are arranged on one and the same side of the memory cell array 1.

The detection circuit 20 is provided with transistors S1 and S2 in correspondence with the columns Y1 and Y2 for discharging an output line L. Transistors T1 and T2, functioning to divide the output line L effectively, are connected to the output line L. The gates of the transistors S1 and S2 are connected to nodes N1 and N2 of the comparator circuit 15, respectively. The transistor S1 is connected between the node n1 and a grounding line. The transistor S2 is connected between the node n2 and the grounding line. A precharging circuit 200 is connected to the output line L. The precharge circuit 200 precharges the output line L in response to the "L" level of a precharge signal $\phi_{PR}$. Inverters G1 and G2 are connected to the one and the other ends of the output line L, respectively. A detection result output line F1 is connected to the output terminal of the inverter G1, while a detection result output line F2 is connected to an output terminal of the inverter G2.

Figure 3:
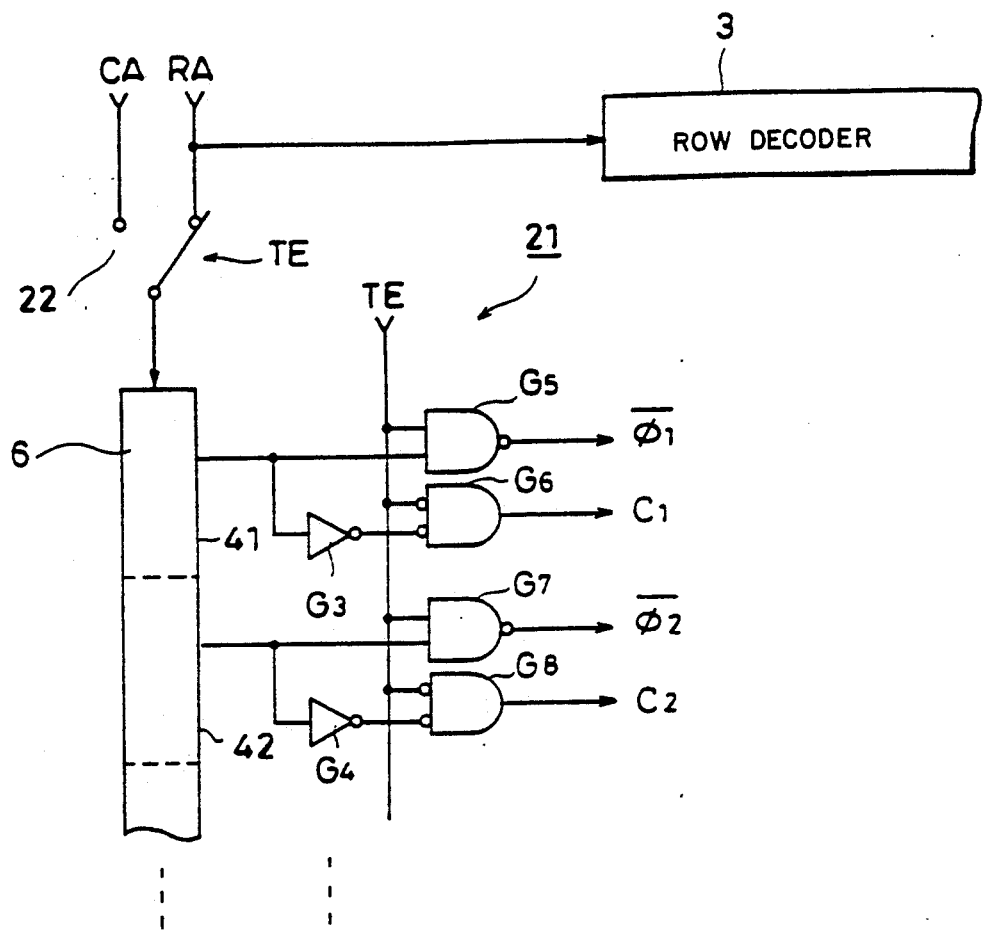
FIG. 3 shows the structure of a signal generator of the dynamic RAM shown in FIG. 1.
Figure 4:
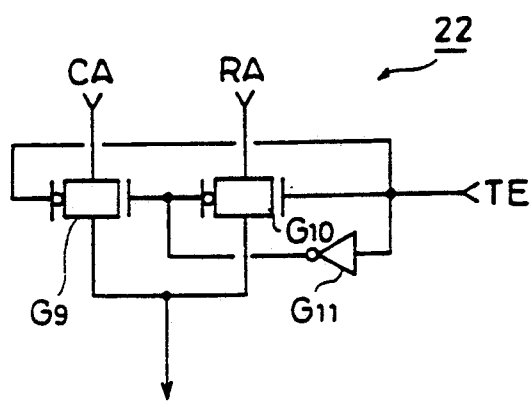
FIG. 4 is a circuit diagram showing the detailed structure of a switch of the dynamic RAM shown in FIG. 1.

FIGS. 3 and 4 show the structure of the signal generator 21 and the switch 22.

The switch 22 is responsive to a test enable signal TE supplied from a line test controller 17 to supply one of the column address signal CA and the row address signal RA to the column decoder 6. The output of a decoder circuit 41 included in the column decoder 6 is supplied to one input terminal of an NAND gate G5, while being supplied to one input terminal of a NOR gate G6 by way of an inverter G3. Similarly, the output of a decoder circuit 42 is supplied to one input terminal of a NAND gate G7, while being supplied to one input terminal of a NOR gate G8 by way of an inverter G4. The test enable signal TE is supplied to the other input terminals of the NAND gates G5, G7 and the NOR gates G6, G8.

The test enable signal TE goes to the "L" level during the normal reading or writing operation, while going to the "H" level during line mode testing. During the normal reading or writing operation, the column address signal CA is supplied to the column decoder 6. Thus outputs obtained by decoding the column address signal CA are supplied at the NOR gates G6 and G8 as column select signals C1 and C2, respectively. On the other hand, during line mode testing, the row address signal RA is supplied to the column decoder 6. Thus inverted signals of outputs obtained by decoding the row address signal RA are outputted as control signals $\phi 1$ and $\phi 2$ at the NAND gates G5 and G7, respectively.

These column select signals C1 and C2 are respectively supplied to gates of transistors Q9, Q10 and transistors Q11, Q12 of the I/O switch 5 shown in FIG. 2. The control signals $\phi 1$ and $\phi 2$ are supplied respectively to gates of the transistors T1 and T2.

FIG. 4 shows a detailed circuit for the switch 22 including transfer gates G9, G10 and an inverter G11. In practice, however, there are provided a plurality of the switches 22, one of which is shown in FIG. 4.

The transfer gate G9 is turned on when the test enable signal TE is at the "L" level, while the transfer gate G10 is turned on when the test enable signal TE is at the "H" level.

Figure 5A:
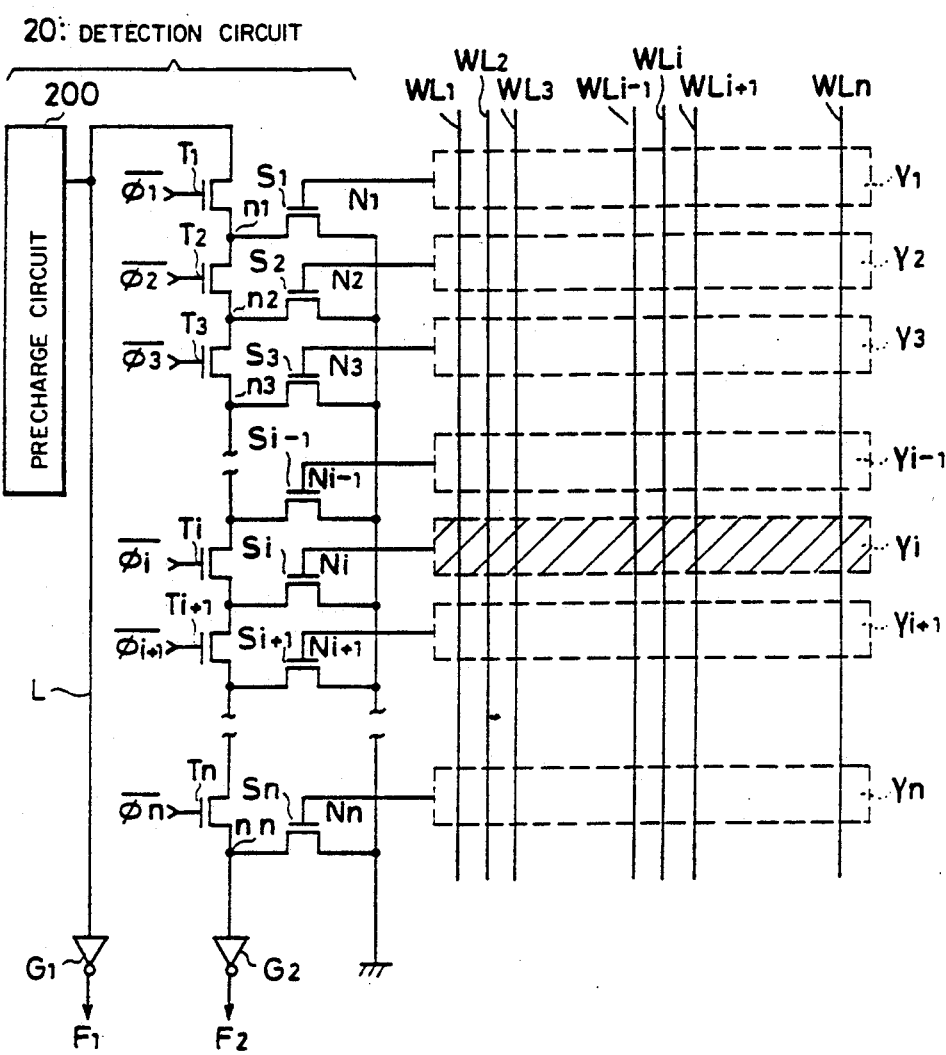
FIG. 5A is a circuit diagram showing the structure of a detection circuit of the dynamic RAM shown in FIG. 1.

FIGS. 2 and 3 show only the two columns Y1 and Y2. In practice, however, the memory cell array 1 includes an n number of columns Y1 to Yn as shown in FIG. 5A. Thus an n number of discharging transistors S1 to Sn and an n number of dividing transistors T1 to Tn are provided in correspondence with the n number of columns Y1 to Yn. Also, an n number of word lines WL1 and WLn are arranged to intersect the columns Y1 to Yn.

The operation of the present embodiment during line mode testing is explained by referring to FIGS. 5A and 5B.

Figure 8:
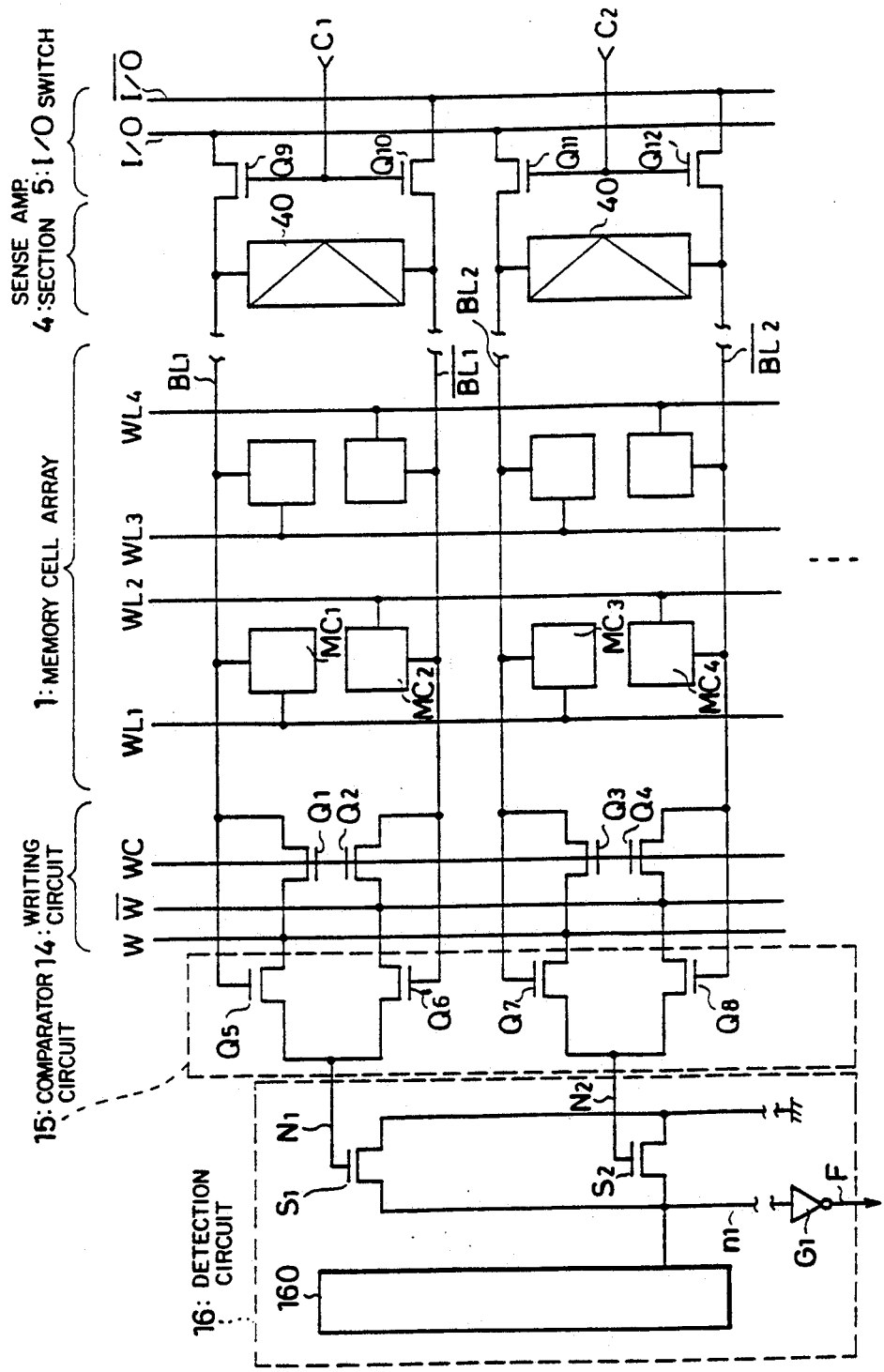
FIG. 8 is a circuit diagram showing the structure of essential parts of the dynamic RAM shown in FIG. 7.
Figure 9:
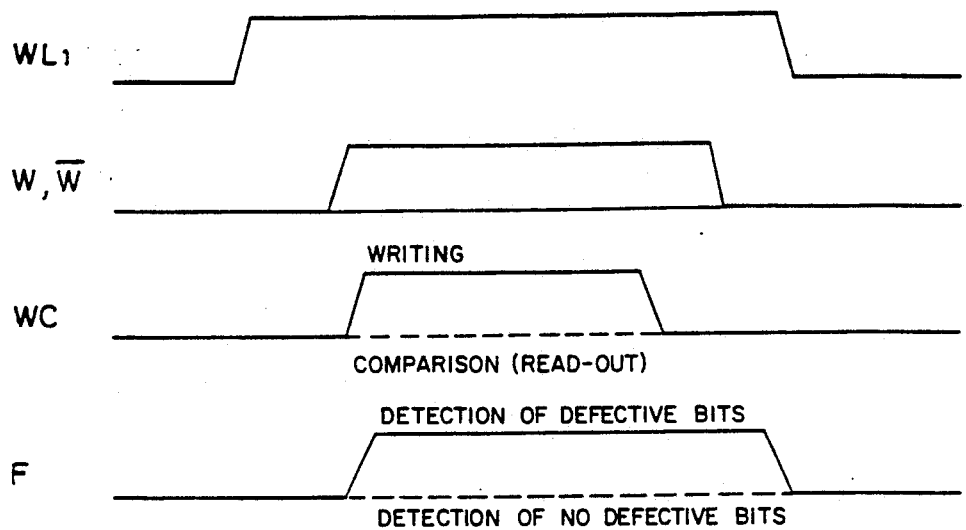
FIG. 9 is a waveform diagram for illustrating the operation in line mode testing.
Figure 10:
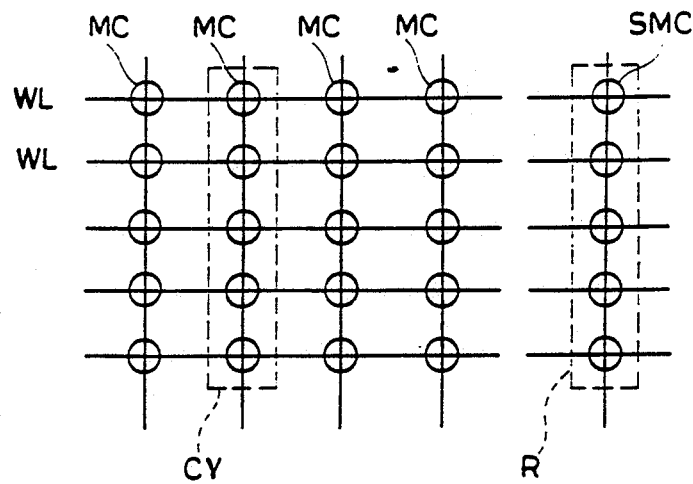
FIG. 10 is a diagram for explaining replacement of the column including Y line failure with a redundancy circuit.

The operation of the write circuit 14 and the comparator circuit 15 during line mode testing is the same as that of the conventional dynamic RAM shown in FIG. 8. It is now assumed that the i-th column Yi suffers from the Y line failure.

The row decoder 3 shown in FIG. 3 selects the word line WL1 responsive to the row address signal RA. Line testing is performed in association with the selected word line WL1. The row address signal RA is also applied at this time to the column decoder 6. Thus, only the control signal $\phi 1$ goes to the "L" level to turn off the transistor T1. As a result, the output line L is divided by the transistor T1 into two portions. Since the column Yi is in trouble, the potential of the node Ni is at the "H" level. This causes an "L" level signal to be outputted at the detection result output line F1, and an "H" level signal to be outputted at the detection result output line F2. When the word line WL2 is then selected, only the control signal $\phi 2$ goes to the "L" level. As a result, the output line L is divided by the transistor T2 into two portions. Also, in this case, an "L" level signal is outputted at the detection result output line F1, and an "H" level signal is outputted at the detection result output line F2. Line testing on the word lines WL1 to WLi gives the same test results, as shown by the solid line at F1 and F2 in FIG. 5B.

When the word line WLi+1 is then selected, only control signal $\phi i+1$ goes to the "L" level. Since the transistor Ti+1 is thereby turned off, an "H" level signal is outputted at the detection result output line F1, and an "L" level signal is outputted at the detection result output line F2, contrary to the above results. Line testing on the word lines WLi+1 to WLn gives the same results as shown by the broken line at F1 and F2 in FIG. 5B.

Referring to FIG. 6A, the memory cell array 1 is divided by a diagonal line l into a region corresponding to the detection result output line F1 and a region corresponding to the detection result output line F2. When the Y line failure exists at the column Yi, the signals on the detection result output lines F1 and F2 are inverted at a point of the output line L corresponding to the intersecting point of the column Yi and the diagonal line l.

Thus, referring to FIG. 6B, when one of the word lines WL1 to WLi is selected, an "L" level signal appears on the detection result output line F1, while an "H" level signal appears on the direction result output line F2. When one of the word lines WLi+1 to WLn is selected, an "H" level signal appears on the direction result output line F1 and an "L" level signal appears on the detection result output line F2. Thus the position of the Y line failure can be located by monitoring the point at which the outputs of the detection result output lines F1 and F2 are changed from the "L" level to the "H" level or from the "H" level to the "L" level.

During normal reading or writing operation, the test enable signal TE goes to the "L" level, so that the column address signal CA is supplied to the column decoder 6. Hence, one of the transistor sets in the I/O switch 5 is turned on by the column select signal. As a result, the corresponding bit line pair is connected to the input/output line pair I/O, I/O. At this time, the control signals $\phi 1$ to $\phi n$ are all maintained at the "H" level. In this manner, the normal read-out or writing operation is performed in the same way as for the conventional dynamic RAM shown in FIG. 8.

In the above embodiment, the output line L is divided sequentially by the transistors T1 to Tn in synchronizing with the selection of the word lines WL1 to WLn. In this manner, a Y line failure may be detected at the same time that line mode testing is performed on the word lines, so that the Y line failure can be detected in a shorter time.

In the above embodiment, testing time is further shortened, since the row address signal RA is employed for selecting the dividing transistors T1 to Tn. However, the column address signal CA may be applied during line mode testing to the column decoder 6 and the control signals $\phi 1$ to $\phi n$ may be controlled on the basis of the column address signal applied from outside.

In the above described embodiment, the write circuit 14, the comparator circuit 15, the detection circuit 20 and the signal generator 21 are arranged on the side of the column decoder 6, so that a particular advantage in circuit layout may be occurred. However, this disposition is merely illustrative and a more compact circuit design may be achieved by using a disposition of the component circuits other than one explained in the foregoing. For example, the write circuit 14, the comparator circuit 15 and the detection circuit 16 may be arranged on the opposite side of the column decoder 6 with respect to the memory cell array 1 as in the case of the conventional dynamic RAM shown in FIG. 7.

Also, while the n×n bit memory cells of the memory cell array 1 are shown in the above embodiment, this is merely illustrative and the present invention may be applied to the memory cell array comprised of m×n bit cells, wherein m>n. When m indicates the number of the word lines and n the number of the bit lines, the arrangement may be so made that each one of the dividing transistors is turned off each time plural word lines are selected. Also, while the dividing transistor is provided for each bit line pair in the above embodiment, the dividing transistor may be provided for a plurality of bit line pairs. According to the present invention, two Y line failures can be detected. If a plurality of Y line failures exist, two Y line failures at both ends of these Y line failures can be detected. From the foregoing it will be seen that the present invention provides an arrangement in which so-called Y line failures may be simultaneously detected with line mode testing, so that the testing time for semiconductor memory devices may be reduced significantly, while the ability for detecting troubles may be improved. Thus the present invention may be applied to testing for using redundant circuits. As a consequence, the testing efficiency for semiconductor memory devices may be improved, while the manufacture cost per chip may also be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a plurality of word lines, a plurality of bit lines arranged to intersect said word lines and a plurality of memory cells arranged at points of intersection of said word lines and said bit lines, said memory device further comprising
   first selection means for selecting said word lines during testing,
   a plurality of detection means for detecting possible failures respectively of the memory cells connected to the word line selected by said first selection means during testing,
   an output line provided in common in said detection means and having plural junction points to which detection results by said detection means are separately applied, and
   dividing means for dividing said output line into two parts at a portion between ones of said junction points in correspondence with the word line selected by said first selection means.

2. The semiconductor memory device according to claim 1, wherein
   each of said plural detection means includes comparator means for comparing data read out from the corresponding one of the memory cells connected to the selected word line with data supplied from outside and outputting the results of comparison as the detection results.

3. The semiconductor memory device according to claim 2, wherein
   each of said plural detection means includes write means for writing data applied from outside to plural memory cells connected to the selected word line.

4. The semiconductor memory device according to claim 1, wherein said dividing means includes
   a plurality of switching means provided between the junction points, respectively,
   the switching means corresponding to the selected word line out of said switching means, being rendered non-conductive, the remaining switching means being rendered conductive.

5. The semiconductor memory device according to claim 4, further comprising
   second selection means for rendering those switching means corresponding to the selected word line non-conductive during testing.

6. The semiconductor memory device according to claim 5, wherein
   said first selection means comprises a row decoder responsive to a row address signal supplied from outside for selecting one of said word lines, and
   said second selection means comprises a column decoder responsive to a row address signal applied from outside for selecting one of said switching means to render the selected switching means non-conductive during testing, said second selection means being responsive to the column address signal applied from outside for selecting one of said bit lines during normal operation.

7. The semiconductor memory device according to claim 6, further comprising
   switching means responsive to a test signal applied from outside for applying the row address signal applied from outside to said column decoder during testing, and for applying the column address signal applied from outside to said column decoder during the normal operation.

8. The semiconductor memory device according to claim 2, wherein each of said detection means comprises further a plurality of switching elements, each of said switching elements being connected between the corresponding junction point and a predetermined potential and having a control electrode to which a detection result from the corresponding comparator means is applied.

9. The semiconductor memory device according to claim 4, wherein
   each of said switching means comprises a MOS transistor.

10. A semiconductor memory device comprising, on a common chip:
    a plurality of word lines;
    a plurality of bit lines arranged to intersect said word lines;
    a plurality of memory cells at intersections of said word lines and said bit lines;
    means for carrying out line mode testing of successing word lines wherein all memory cells connected to a word line under test are tested simultaneously;
    detector means for correlating said bit lines to said word lines being tested; and
    output means responsive to said detector means for generating a signal identifying the location or locations of at least one bit line failure.

* * * * *